(12) United States Patent
Chiu

(10) Patent No.: US 7,199,466 B2
(45) Date of Patent: Apr. 3, 2007

(54) PACKAGE DESIGN USING THERMAL LINKAGE FROM DIE TO PRINTED CIRCUIT BOARD

(75) Inventor: Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 46 days.

(21) Appl. No.: 10/836,329

(22) Filed: May 3, 2004

(65) Prior Publication Data

US 2005/0245060 A1    Nov. 3, 2005

(51) Int. Cl.
*H01L 23/10* (2006.01)

(52) U.S. Cl. .................. 257/707; 257/713; 257/737; 257/E23.105

(58) Field of Classification Search ............... None
See application file for complete search history.

(56) References Cited

U.S. PATENT DOCUMENTS

| | | | |
|---|---|---|---|
| 6,451,418 B1 * | 9/2002 | Tobita | 428/297.4 |
| 6,900,535 B2 * | 5/2005 | Zhou | 257/707 |
| 2002/0079562 A1 | 6/2002 | Zhao et al. | 257/678 |
| 2003/0035269 A1 | 2/2003 | Chiu | 361/704 |
| 2003/0146519 A1 * | 8/2003 | Huang | 257/778 |
| 2003/0150645 A1 | 8/2003 | Chiu | 174/264 |
| 2003/0183909 A1 | 10/2003 | Chiu | 257/667 |
| 2004/0184240 A1 * | 9/2004 | Su | 361/717 |
| 2005/0023677 A1 * | 2/2005 | Zhao et al. | 257/734 |
| 2005/0109534 A1 * | 5/2005 | Chengalva et al. | 174/256 |

* cited by examiner

*Primary Examiner*—Dung A. Le
(74) *Attorney, Agent, or Firm*—The Fleshner Group, PLLC

(57) ABSTRACT

A substrate is provided that may include an area designated for mounting of an integrated circuit and one or more areas for retaining a thermal interface material proximate the integrated circuit mounting area. A thermal interface material containment area(s) may be formed by creating a through-hole in the substrate, or a recess in the substrate that opens either to the die placement side or the opposite side of the substrate.

25 Claims, 8 Drawing Sheets

PACKAGE DESIGN USING THERMAL LINKAGE FROM DIE TO PRINTED CIRCUIT BOARD

FIELD

Embodiments of the present invention may relate to thermal management of electronic devices. More particularly, embodiments of the present invention may relate to substrate configurations for increased heat dissipation in semiconductor devices.

BACKGROUND

The reliability, durability, and functional integrity of electrical components can be inversely related to the operating temperatures experienced in such devices, whether the heat is generated by the device itself or from other sources. Semiconductor technology can be characterized as a quest to place more electronic components in less space to achieve greater speed and performance. As integrated circuits (IC's) and other semiconductor devices become faster, operating frequencies (e.g., clock speed in a microprocessor) also increase. At the same time, the distances between the conductive lines within the semiconductor device are reduced due to efforts to construct semiconductor devices that are increasingly compact. As the density of conductive lines and the clock speed of circuits increase, the amount of heat experienced in the device also increases. Therefore, it is critical to have an efficient heat removal system associated with IC's.

IC's can be formed on microelectronic dies and assembled into microelectronic packages by physically and/or electrically coupling the IC's to a package substrate. One or more microelectronic packages can be physically and/or electrically coupled to a printed circuit board (PCB) to form an "electronic assembly." The electronic assembly can be part of an "electronic system." An electronic system may be broadly defined herein as any product that includes an electronic assembly. Examples of electronic systems may include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

Specific areas of a die on which an IC is formed may be more frequently used than other areas of the die. For example, a floating point unit (FPU) area may generate a higher amount of heat than other areas on the die. The FPU areas lead to "hot spots" on the die that significantly increase the local temperature surrounding the hot spots, and also elevate the overall average temperature of the die.

One technique of conducting heat away from an IC chip may be by heat transfer to the PCB, and then to the case. The PCB may include features such as thermal vias and/or ground planes to further conduct the undesirable heat. Accordingly, "junction-to-board" thermal resistance is a factor in achieving efficient heat transfer to the PCB. The IC chip and the PCB may be spaced apart in an integrated semiconductor package assembly, such that the chip die and the PCB are not in direct contact. Thus, impediments to optimal junction-to-board heat transfer include substances interposed between the chip die surface and the PCB surface, such as air, or a substrate material in a wire bonding package (e.g., a stacked chip scale package (SCSP)), or an underfill material and/or solder bumps in a ball grid array (BGA) package assembly.

BRIEF DESCRIPTION OF THE DRAWINGS

The foregoing and a better understanding of the present invention will become apparent from the following detailed description of arrangements and example embodiments (and the claims) when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

The following represents brief descriptions of the drawings in which like reference numerals represent like elements and wherein.

DETAILED DESCRIPTION

Figure 1:
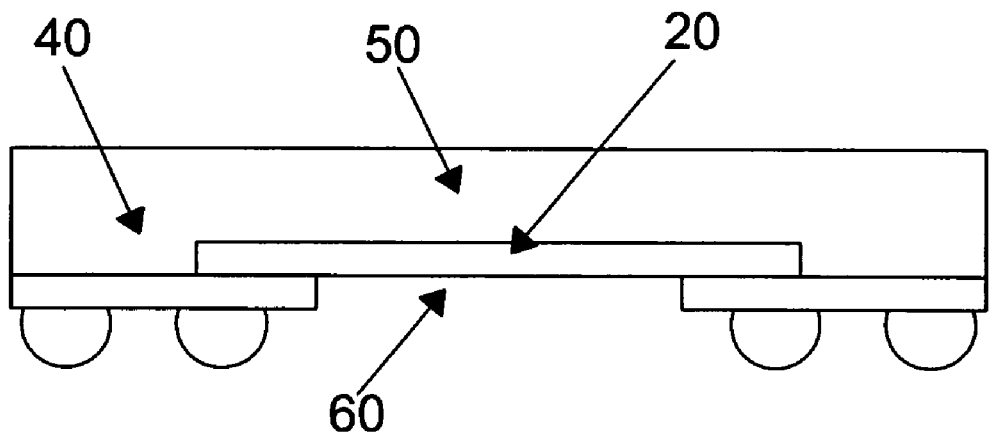
FIG. 1 is a cross-sectional side view of a package assembly according to an example embodiment of the present invention.

In the following detailed description, like reference numerals and characters can be used to designate identical, corresponding or similar components in differing figure drawings. Further, in the detailed description to follow, example sizes, models, values, ranges, and the like can be given although the present invention is not limited to the same. Where specific details are set forth in order to describe example embodiments of the invention, it should be apparent to one skilled in the art that the invention can be practiced without these specific details.

Positional terminology (e.g., on, above, under, lower, beneath, laterally, top, upward, face down, underside, etc.) may be used herein for ease of describing a position of the described components relative to each other, and not to an actual orientation of the components with respect to any particular vertically or horizontally defined plane. That is, it should be appreciated that directional terms used herein are not meant to limit embodiments of the present invention to any particular fixed point of reference in practicing embodiments of the present invention and/or, for instance, in the use or incorporation of embodiments of the present invention as a finished product into another system.

Various arrangements and embodiments of the present invention will now be described with respect to the respective figures.

Figure 12:
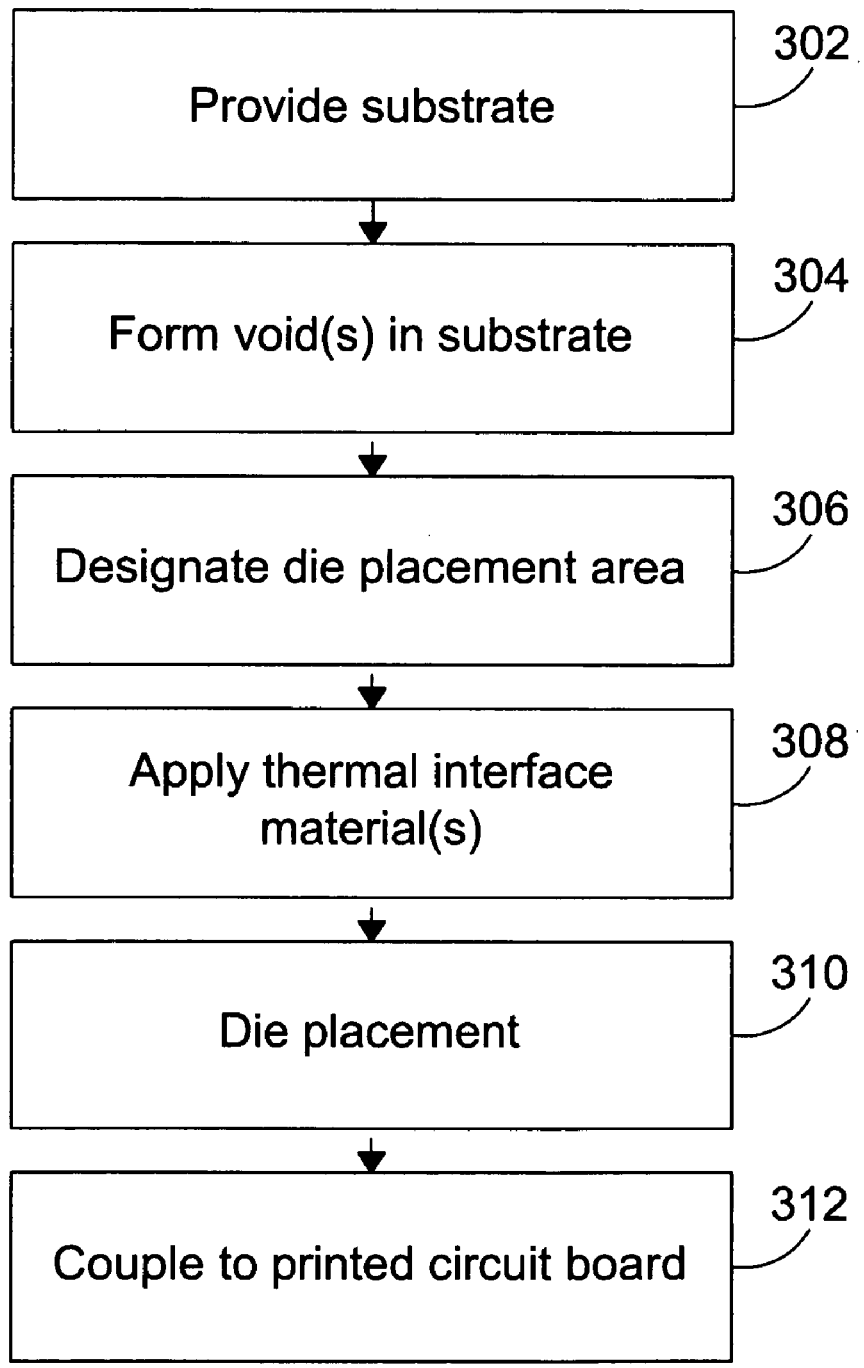
FIG. 12 is a flowchart showing operations according to an example embodiment of the present invention.

With reference to FIG. 12, embodiments of the present invention may provide a method of making a package assembly that involves obtaining a substrate, and identifying a die placement area thereof, and forming at least one thermal interface material (TIM) receiving cavity therein, as shown, for example, in blocks 302, 306, and 304, respectively. The method may include attaching an integrated circuit or chip die to the die placement area, as shown for example, in block 310. The method may include filling the cavity of the substrate with TIM, as shown for example, in block 308. The method may include attaching the substrate to a printed circuit board (PCB) as shown for example, in block 312. The TIM may be in thermal communication with the integrated circuit, the substrate, the PCB, or any combination thereof. Other operations, order or sequence of operations and embodiments are also within the scope of the present invention.

The substrate may be any carrier substrate or package substrate (e.g., an interposer, a motherboard, a nonactive surface of a die, and the like) suitable for supporting various components, such as a semiconductor chip die or integrated circuit. The substrate may be a rigid, semi-rigid, or flexible material. Exemplary types of substrates include metal, plastic, organic material, bismaleimide-triazine (BT) resin, ceramic, tape (flex), polymeric, epoxy-glass (e.g., FR-4), polymide-glass, benzocyclobutene, Teflon, injection molded plastic, deposition, and combination substrates. Other types of substrates are possible.

The substrate may or may not include various layers of like or dissimilar materials, including a resist layer. That is, the various layers including the solder resist layer may be considered as part of the substrate. The substrate may also contain or have embedded routing traces, conductive layers, power/ground planes, vias, and the like. One or more surfaces of the substrate may include a solder land(s), bond pad(s), and/or any other interconnect(s) or relief, for instance, a trench. The substrate may have any dimensions, for example, a thickness of from about 0.1 to about 10 mm, for example, about 1 to about 1.5 mm. Other thicknesses are possible, and the thickness of the substrate may vary. The substrate may have any regular or irregular shape. The substrate may have a first substantially planar surface and a second, opposing substantially planar surface that is parallel to the first surface. The substrate may be an individual piece, such as a wafer, or a precut unit from which a plurality of substrates may be formed.

The die placement area may be at any location on one or more surfaces of the substrate. The die placement or location area may or may not be delineated or otherwise defined on the substrate. The die placement area or section may define an area in which to affix or attach an integrated circuit or microelectronic device. The die mounting or placement area may have any shape and/or dimensions, for example, the die placement area may take the shape of an attached chip die. A periphery or boundary of the die placement area or region may lie within an outer edge or perimeter of the substrate. That is, a cross sectional area of the die placement area may be less than a cross sectional area of the surface of the substrate upon which the die placement area is located. The die placement or attachment area may or may not be centrally located or centered on the substrate. All or any portion of a surface of the die placement area may be prepared to receive a semiconductor chip or die.

One or more heat generating devices such as a silicon die or a III–V semiconductor compound die may be provided in the die placement area or any portion thereof. The die and the substrate may have abutting surfaces and/or be in spaced relation. The die may be mounted active side up or active side down on the substrate. Any one of a plurality of methods or materials may be used to physically and/or electrically connect or couple the die to the substrate. For example, an underfill or other compound material may be disposed between a joining surface of the die and a joining surface of the substrate to secure or bond the die to the substrate. Conductive media such as solder balls or bumps may be disposed between the confronting surfaces of the die and the substrate. Wire bonding technology, metallization, flip chip technology, for example, using controlled collapsed chip connection (C4), or combinations thereof may be used. For example, the die arrangement may include ball grid array (BGA) and/or stacked chip scale package (SCSP) configurations. Other configurations are possible.

The TIM receiving cavity or receptacle may be at any location on one or more surfaces of the substrate. At least a portion of a cross sectional area of the TIM receiving cavity or void may superpose or overlap the cross sectional area of the die placement area. That is, at least a portion of the TIM receiving cavity or area may be directly beneath or at least partially cover a portion of the die placement area. A periphery or boundary of the TIM receiving cavity or opening may lie within an outer edge or perimeter of the die placement area. That is, a cross sectional area of the TIM receiving cavity or hole may be entirely within or covered by a cross sectional area of the die placement area. The TIM receiving or placement cavity may be in alignment or registration with the die placement area and/or the die. The TIM receiving cavity may be located in an area under or over the portions of maximum heat of the die. For example, the TIM receiving cavity may be formed atop or underneath one or more spots on the die that achieve the highest operating temperature, e.g., hot spots.

The TIM receiving cavity or space may have any regular or irregular shape and/or dimensions, and may or may not have a periphery that is similar to or substantially the same as a periphery of the die placement area and/or the die. The cross sectional area of the TIM receiving or retaining cavity be any size less than the cross sectional area of the substrate, and may be less than or greater than the cross sectional area of the die placement area and/or the die. For example, the cross sectional area of the TIM receiving cavity or gap may be from about 1 to about 1000 mm$^2$, for example, about 10 to about 100 mm$^2$. Other areas are possible. The cross sectional area of the TIM receiving cavity or TIM cavity may be constant or vary. The TIM receiving or holding cavity may have any depth less than the thickness of the substrate, as described in detail below. For example, the TIM cavity or hollow may be about 10 to about 0.1 mm or less in depth, for example, from about 1.5 to about 1 mm. Other depths are possible.

The TIM receiving cavity may have a depth that is equal to the thickness of the substrate. That is, the TIM receiving cavity may be a through hole or channel in the substrate. The TIM receiving aperture may define a passage or duct through the substrate from a first surface of the substrate to an opposing second surface. For example, from the surface of the substrate in which the die placement area is located to the surface of the substrate which may be mounted on a PCB. The TIM receiving hole may define at least a portion of the die placement area.

The TIM receiving cavity may have a depth that is less than the thickness of the substrate. That is, the TIM cavity may be a recess or groove in the substrate. The TIM receiving recess may define a pocket or chamber in the substrate that opens to a surface of the substrate. An interior surface of the substrate may define the bottom of the TIM recess or pit. For example, the TIM recess may open to the surface of the substrate in which the die placement area is located. Thus, at least a portion of the die placement area may be defined by the TIM recess, exposing at least a portion of the die. The TIM recess may open to the opposite surface of the substrate. Thus, a portion of the substrate may be disposed between the TIM recess and the die placement are and/or the die.

The substrate may have a plurality of TIM cavities. The TIM cavities may be formed on one, two, or more surfaces of the substrate. The TIM cavities may be through holes, recesses, or both. Recesses may or may not be disposed on opposing sides of the substrate. For example, the substrate may have TIM recesses facing upward and downward, which may or may not be superposed. The aggregate or total cross sectional area of the plurality of TIM cavities may be from about 1 to about 1000 mm$^2$, for example, from about 10 to about 100 mm$^2$. Other cross sectional areas are possible.

Two or more of a plurality of TIM cavities may be adapted to be thermally coupled or configured to be interconnected or networked to one another, for example, by ducts or canals or other passageways embedded in the substrate. Two or more of a plurality of TIM cavities may be in thermal communication with each other or thermally linked together, for example, by thermal vias in the substrate. Two or more of a plurality of TIM cavities may be configured to form a common TIM receptacle. For example, the surface of the substrate on which the die placement area is located may have two (or more) cavities. The two (or more) cavities may be conjoined within the substrate to form one (or one less) cavity on the opposing surface of the substrate.

The TIM receiving cavity may be formed in the substrate by any of a number of methods. For example, a predetermined portion of the substrate may be removed by punching, drilling, laser cutting, etching, boring, perforating, or combinations thereof. Other methods are possible. The TIM receiving cavity may be integrally formed with the substrate. Walls of the TIM cavity or reservoir may be defined by the substrate, for example, the interior surfaces of the substrate.

According to an embodiment of the present invention, the TIM is provided in the TIM receiving cavity. The TIM may be any heat conducting substance. The TIM may include, but is not limited to, epoxy, thermal grease, phase-change material, metal filled polymer matrix, elastomer, thermal-conductive tape, or thermally conductive solder material, such as In, In/Sn, In/Ag, Sn/Ag/Cu, Sn/Bi, In/Sn/Bi and In/Zn, Sn/Ag and Sn/In/Ag or other metal or alloy. The TIM may be HiFlux HF-60120, for example, which is commercially available from TherMax Korea Corp. The TIM may or may not include flux or wetting agents.

The TIM may be disposed or coated on any surface, including the TIM cavity walls, the substrate, the die, and/or the PCB. The surfaces may or may not be prepared to affix the TIM, for instance, by electrolytic plating, and the like. The TIM may adhere upon application, and/or the TIM may be heated and the like to set or cure the TIM in place. The TIM may thermally couple or promote thermal communication between various components, for example, the die and PCB. The TIM may thermally couple to thermal vias in the PCB. The TIM may occupy or fill a volume of TIM receiving cavity, for example, of about 10% or less, to about 100%.

FIGS. 1–11 show package assemblies or substrates according to various arrangements and embodiments of the present invention. Other arrangements are also possible. More specifically, FIG. 1 shows an embodiment of the present invention, generally a BGA package assembly using wire bonding technology. A chip die 20 may be attached to a die placement area (not specifically shown) on a substrate 10. The chip die 20 may be electrically connected to solder balls 30 on the underneath side of the substrate 10 by bond wires 40 and vias (not specifically shown) in the substrate 10. A molding compound 50 may or may not be provided over the die 20. A thermal interface material receiving cavity 60 may be formed in the substrate 10 in an area under the die placement area. As shown in FIG. 1, the TIM receiving cavity 60 may be a through hole centered under the chip die 20. The TIM receiving cavity 60 may be located under one or more hot spots on the die 20. A portion of the (nonactive) surface of the die 20 may be exposed by the formation of the TIM receiving cavity 60.

Figure 2:
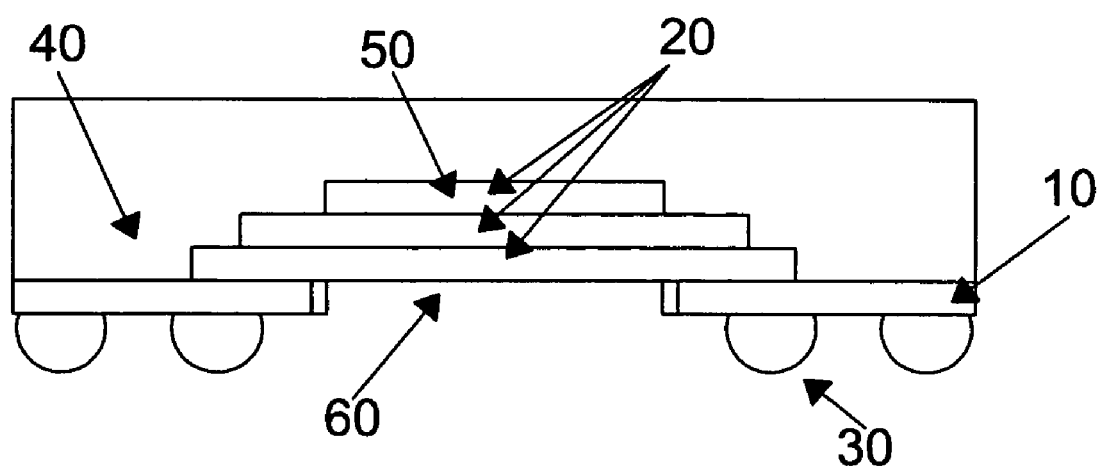
FIG. 2 is a cross-sectional side view of a package assembly according to an example embodiment of the present invention.

FIG. 2 shows an embodiment of the present invention, generally an SCSP assembly having three dies 20. Fewer or more die 20 may be used. As shown in FIG. 2, the TIM receiving cavity 60 may be centered under the dies 20. However, the TIM receiving cavity 60 may be located elsewhere on the substrate 10.

Figure 3:
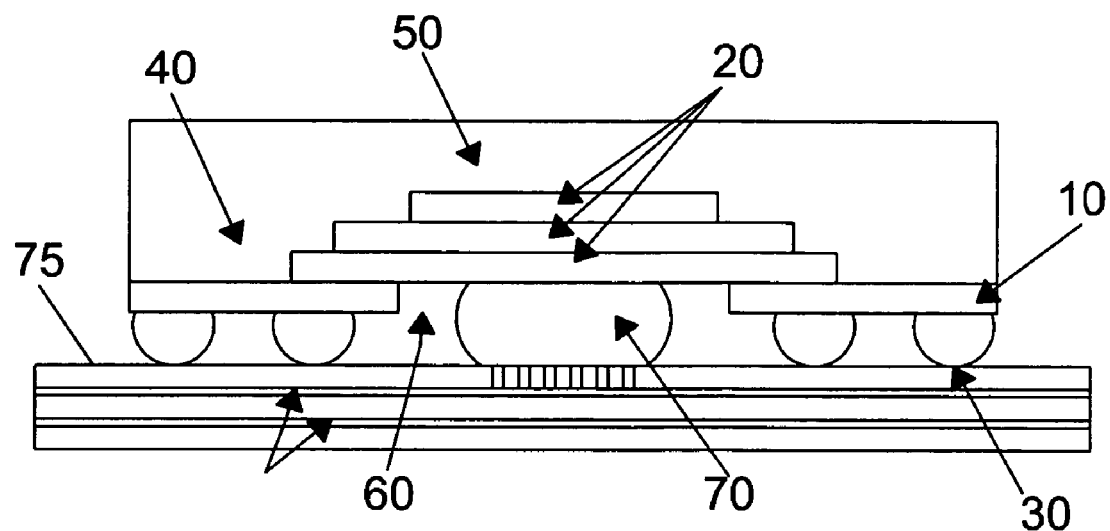
FIG. 3 is a cross-sectional side view of a package assembly according to an example embodiment of the present invention.

FIG. 3 shows an embodiment of the present invention, generally the SCSP of FIG. 2 affixed to a PCB 75, and having a TIM 70 layer formed in the TIM receiving cavity 60. The TIM 70 may be in thermal communication with a portion of the bottom side of the bottom die 20. A greater or smaller area of the die 20 may be contacted by the TIM 70. The TIM 70 also may be in thermal communication with a portion of the PCB 75. The TIM 70 may provide direct and/or indirect thermal linkage of the die 20 and the PCB 75. The PCB 75 may or may not have thermal vias 80 that may be vertically or otherwise oriented that may breach the top surface of the PCB 75 to contact the TIM 70. Fewer or more thermal vias 80 may be used, as well as alternative configurations thereof. The PCB 75 may or may not have power/ground planes 90 that may be horizontally or otherwise oriented, and one or more of which may be in thermal communication with the thermal vias 80. Fewer or more embedded planes 90 may be used, as well as alternative configurations thereof. The solder balls 30 may or may not be in electrical contact with the PCB 75.

Figure 4:
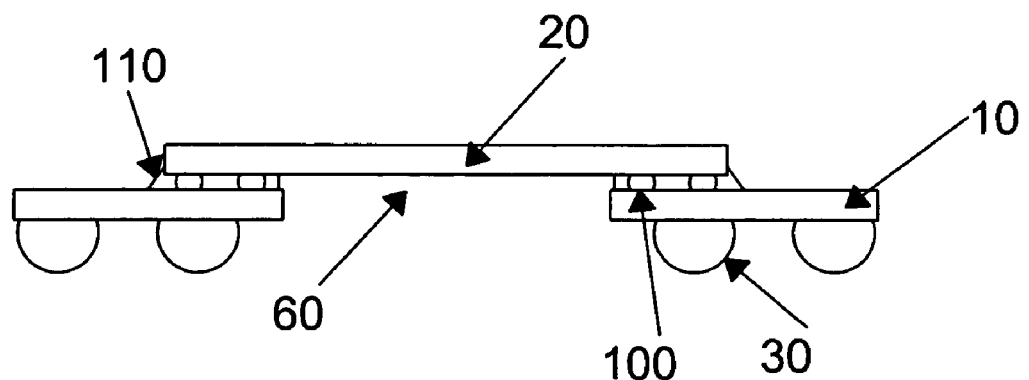
FIG. 4 is a cross-sectional side view of a package assembly according to an example embodiment of the present invention.

FIG. 4 shows an embodiment of the present invention, generally an electronic package assembly using flip chip technology. The chip die 20 may be attached active side down to the package substrate 10 using die bumps 100 and/or underfill material 110 for electrical and/or physical connection. A portion of the bottom side of the die 20 may be exposed by the formation of the TIM cavity 60 in the substrate 10. The underfill material 110 and die bumps 100 may be absent on a portion of the underside of the die 20 that is exposed by the TIM receiving cavity 60.

Figure 5:
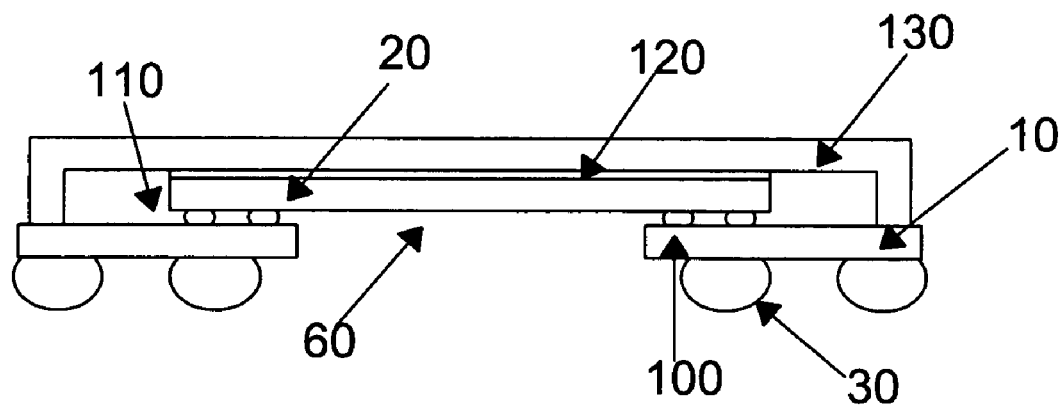
FIG. 5 is a cross-sectional side view of a package assembly according to an example embodiment of the present invention.

FIG. 5 shows an embodiment of the present invention, generally a flip chip similar to that shown in FIG. 4, that includes an integrated heat spreader (IHS) 130 that may be in thermal communication with the top (inactive) side of the die 20. A TIM layer 120 may be disposed between the inside surface of the IHS 130 and the top surface of the die 20. The TIM layer 120 may be any TIM, including the TIM substantially as described above. Other primary heat removal systems may or may not be used, as well as one or more secondary heat removal systems, including, but not limited to, heat pipes, heat sinks, heat sink/fan combinations, and the like.

Figure 6:
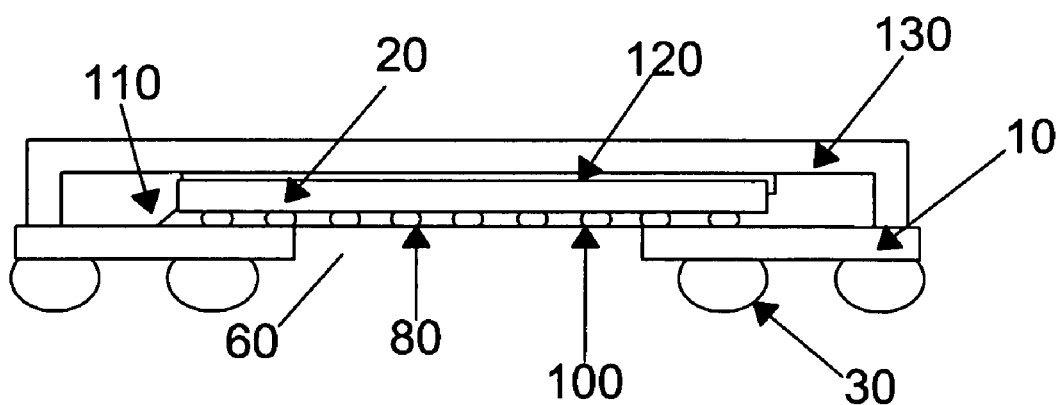
FIG. 6 is a cross-sectional side view of a package assembly according to an example embodiment of the present invention.
Figure 7:
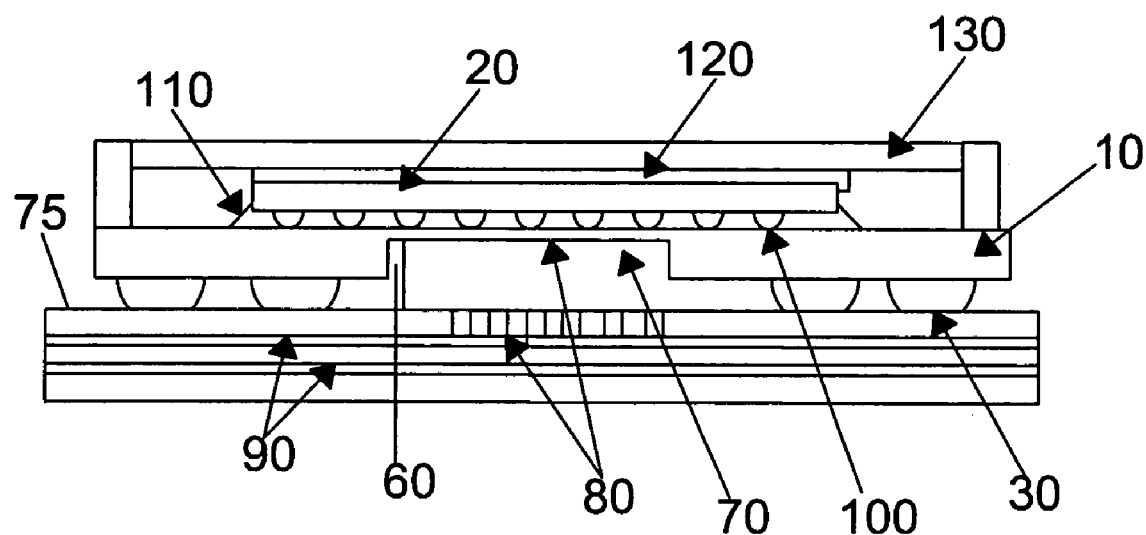
FIG. 7 is a cross-sectional side view of a package assembly according to an example embodiment of the present invention.

FIG. 6 shows an embodiment of the present invention in which a modified package substrate 10 may be used in a flip chip package assembly. The substrate 10 includes a TIM receiving cavity 60 that is a downwardly open recess. A thin layer of the top surface of the substrate 10 may form the bottom wall of the TIM receiving cavity 60 and supports the die bumps 100 and the underfill material 110. Although not specifically shown, the recess may be inverted, i.e., upwardly open, such that a thin layer of the bottom surface of the substrate 10 forms the bottom wall of the TIM receiving cavity 60. Alternatively, the thin layer of a portion of the substrate 10 may be formed anywhere within the TIM receiving cavity 60, to form dual opposing (i.e., back-to-back) recesses having a common bottom wall (not shown). The bottom wall of the recess may be any thickness. The bottom wall of the recess may or may not include thermal vias 80 to provide for thermal communication with the die bumps 100, underfill material 110, the bottom of the die 20, and/or other layers or features. FIG. 7 shows the flip chip of FIG. 6 affixed to a PCB 75, having a TIM 70 layer formed in the TIM receiving cavity 60.

Figure 8:
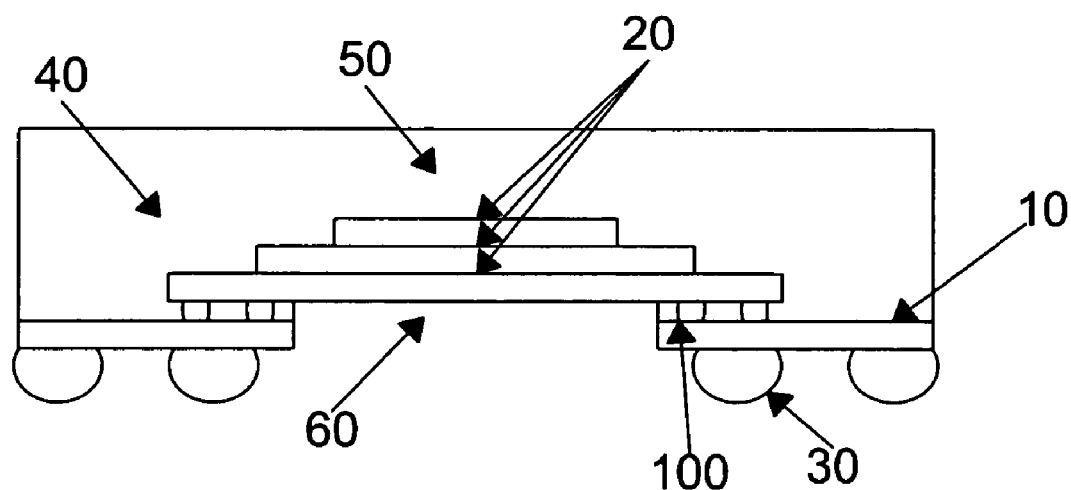
FIG. 8 is a cross-sectional side view of a package assembly according to an example embodiment of the present invention.

FIG. 8 shows an embodiment of the present invention, generally a stacked-die mixed (wire bond and flip chip) package. The underfill material 110 and die bumps 100 may or may not be absent on a portion of the underside of the die 20 that is exposed by the TIM receiving cavity 60.

Figure 9:
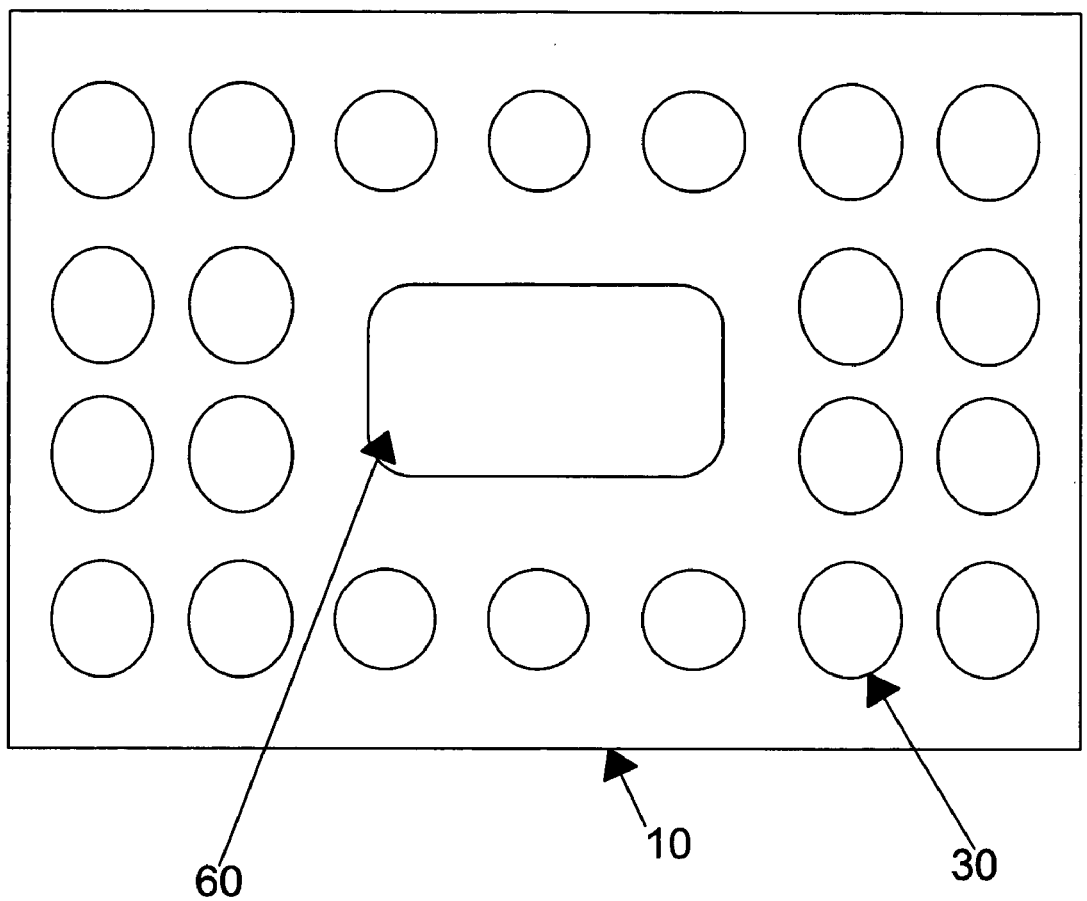
FIG. 9 is a bottom view of a substrate according to an example embodiment of the present invention.

FIG. 9 shows the underside of a substrate 10 according to an embodiment of the present invention. Solder balls 30 may be formed in an array or matrix or other configuration on the bottom surface of the substrate 10. A TIM receiving cavity 60 may be formed in the substrate 10. The opposing side (not shown) of the substrate 10 may have a designated die placement area thereon.

Figure 10:
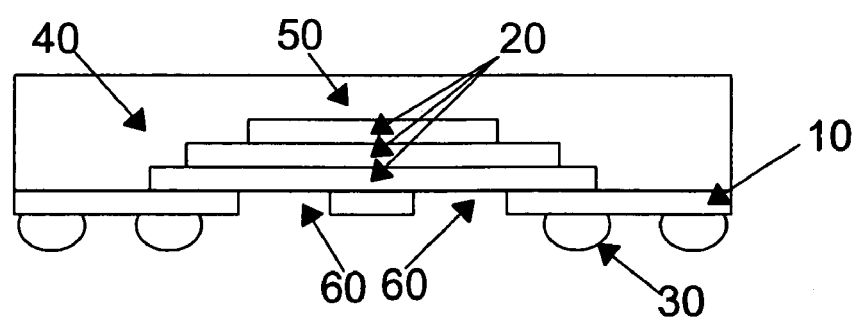
FIG. 10 is a cross-sectional side view of a package assembly according to an example embodiment of the present invention.
Figure 11:
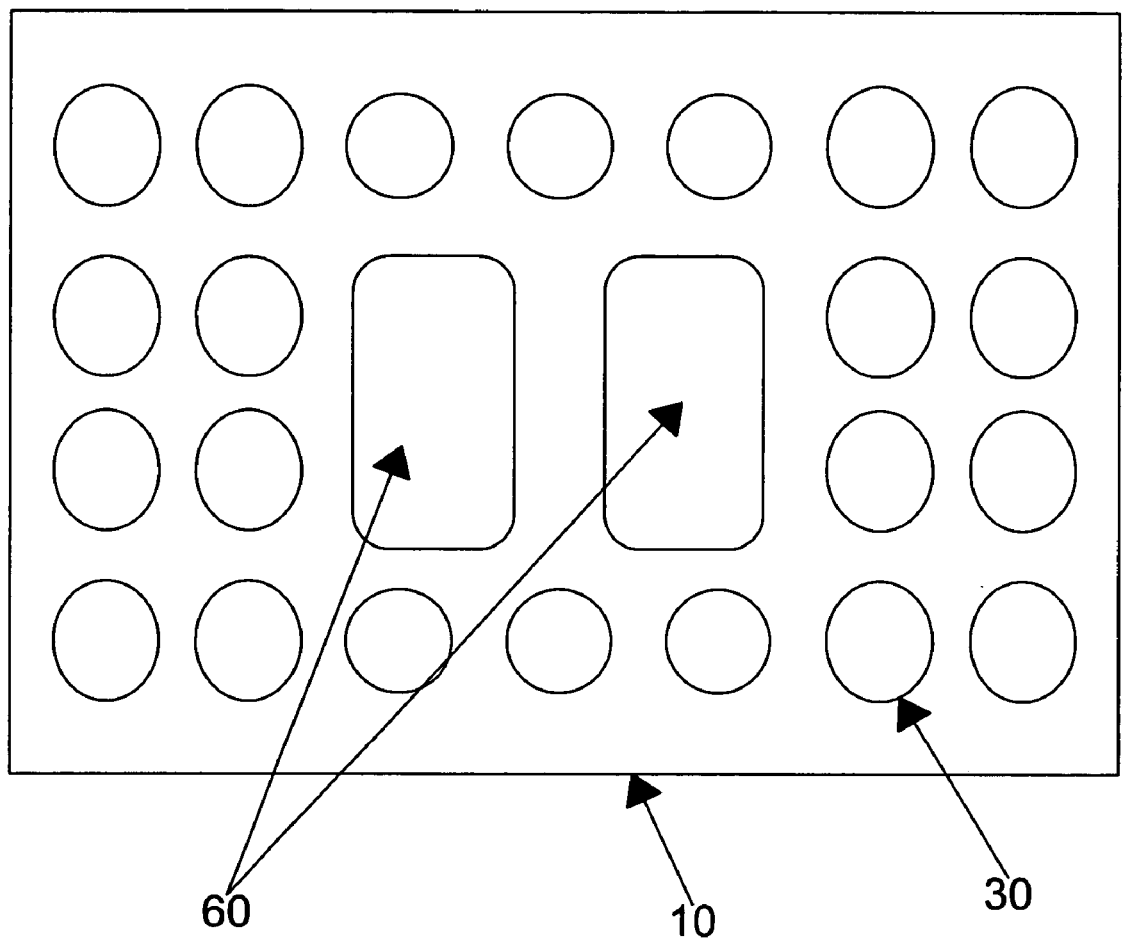
FIG. 11 is a bottom view of a substrate according to an example embodiment of the present invention.

FIG. 10 shows an embodiment of the present invention, generally an SCSP assembly. The substrate 10 may have two or more (not shown) TIM receiving cavities 60 formed therein. The TIM receiving cavities 60 may be in any configuration on the substrate 10. Although not specifically shown, a combination of through holes and recesses may be provided in the substrate 10. Although not specifically shown, any two or more TIM receiving cavities 60 may be configured to be thermally coupled to each other, for instance, by tunnels or channels in the substrate 10, for disposing the TIM 70, and/or using thermal vias to interconnect or network the TIM receiving cavities 60. FIG. 12 shows the underside of the substrate 10 of FIG. 10 according to an embodiment of the present invention. The opposing side (not shown) of the substrate 10 may have a designated die placement area thereon.

Although much of the description herein is directed to a substrate and a TIM that are used with a semiconductor die, it is to be understood that embodiments of the present invention may apply broadly to any substrate that contacts, by way of a thermal conducting material, any solid surface or device from which one may want to dissipate heat.

Embodiments of the present invention may reduce junction-to-board thermal resistance by an amount of about 44% or more compared to using a substrate package that does not include a TIM receiving cavity. Embodiments of the present invention may obviate the need for additional substrate layers. On or more of the above features may reduce the overall size of the microelectronic package assembly and/or costs associated with the production thereof.

Additionally, embodiments of the present invention may be provided within one or more component packages, such as integrated circuit packages, which may be physically and electrically coupled to a printed circuit board to form an electrical assembly. The term electrical assembly may be part of an electronic system. An electronic system may be any product including an electronic assembly. Examples of electronic systems include computers (e.g., desktop, laptop, hand-held, server, etc.), wireless communications devices (e.g., cellular phone, cordless phones, pagers, etc.), computer-related peripherals (e.g., printers, scanners, monitors, etc.), entertainment devices (e.g. televisions, radios, stereos, tap and compact disc players, video cassette recorders, MP3 (Motion Picture Experts Group, Audio Layer 3) players, etc.), and the like.

Figure 13:
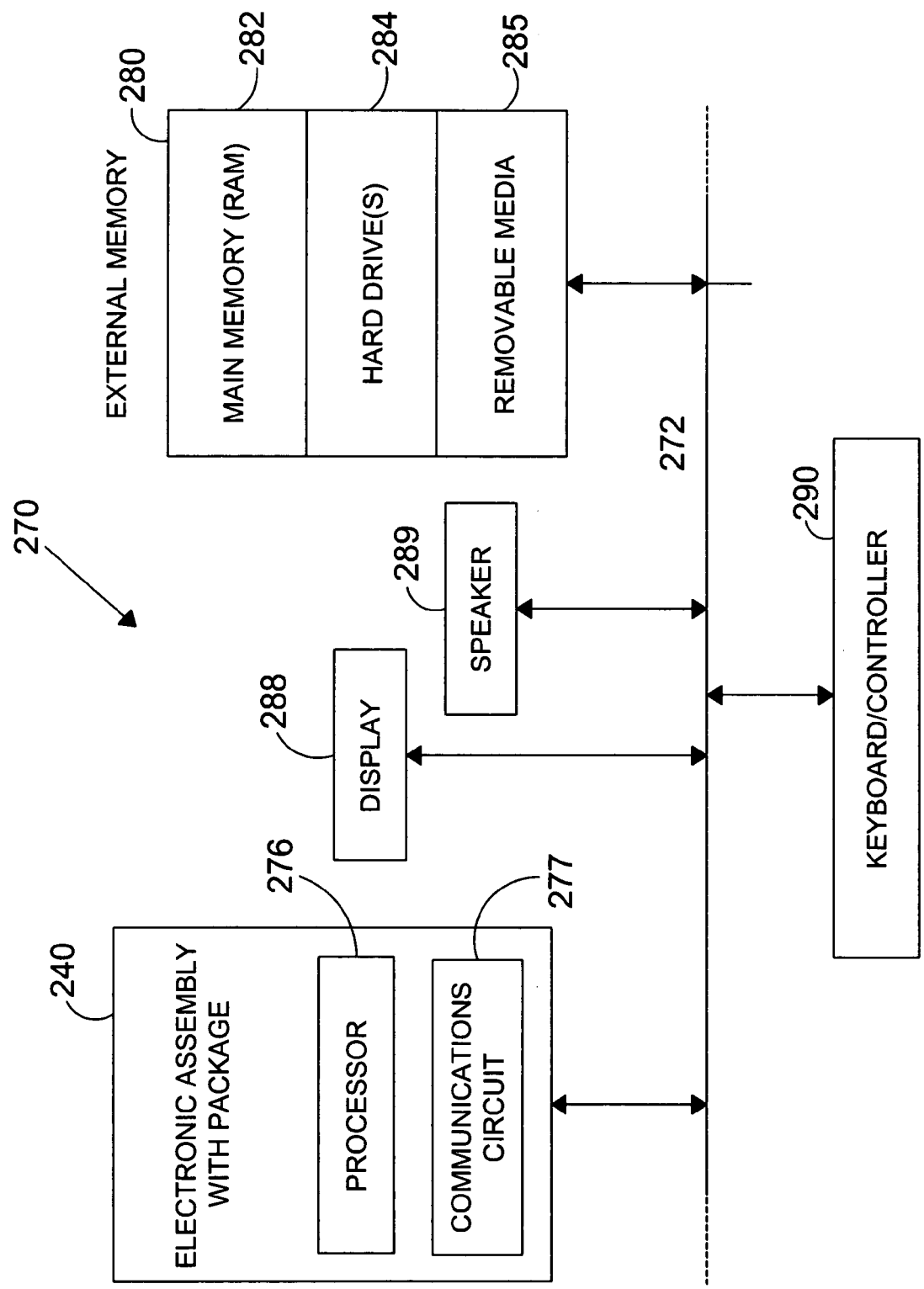
FIG. 13 is a block diagram of an electronic system according to an example embodiment of the present invention.

FIG. 13 is a block diagram of an electronic system 270 incorporating at least one package substrate in an electronic assembly 240, such as a package substrate illustrated in any of FIGS. 1–11. The electronic system 270 may be a computer system that includes a system bus 272 to electrically couple together the various components of electronic system 270. The system bus 272 may be a single bus or any combination of busses.

The electronic assembly 240 may be coupled to the system bus 272 and may include any circuit, or combination of circuits, for example, a processor 276 which may be of any type. As used herein, processor may relate to any type of circuit such as, but not limited to, a microprocessor, a microcontroller, a graphics processor or a digital signal processor. Other types of circuits that can be included in the electronic assembly 240 are a custom circuit or an application-specific integrated circuit, such as a communications circuit 277 for use in wireless devices such as cellular telephones, pagers, portable computers, two-way radios, and similar electronic systems.

The electronic system 270 may also include an external memory 80 that in turn may include one or more memory elements suitable to the particular application, such as a main memory 282 in the form of random access memory (RAM), one or more hard drives 284, and/or one or more drives that handle removable media 286, such as floppy diskettes, compact disks (CDs) and digital video disks (DVDs). The electronic system 270 may also include a display device 288, a speaker 289, and a controller 290, such as a keyboard, mouse, trackball, game controller, microphone, voice-recognition device, or any other device that inputs information into the electronic system 270.

As shown herein, the present invention can be implemented in a number of different embodiments, including an electronic package, an electronic system, a computer system, one or more methods of fabricating an electronic package, and one or more methods of fabricating an electronic assembly that includes the package. The elements, materials, geometries, dimensions, and sequence of operations can all be varied to suit particular packaging requirements.

Additionally, while embodiments have been described with respect to integrated circuits mounted on an integrated substrate, embodiments of the present invention are not limited only to such applications, as they may be used for other types of electronic packages and other types of components, such as passive components, hybrid modules, printed circuit boards, mezzanine boards, and for any other type of electrical structure requiring heat dissipation.

Any reference in this specification to "one embodiment," "an embodiment," "example embodiment," etc., may mean that a particular feature, structure, or characteristic described in connection with the embodiment is included in at least one embodiment of the invention. The recitation of such phrases in various places in the specification does not necessarily refer to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

Although embodiments of the present invention have been described with reference to a number of illustrative embodiments thereof, it should be understood that numerous other modifications and embodiments may be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. An apparatus comprising:
   a circuit board;
   a thermal interface material to couple with the circuit board;
   a substrate having a die placement area and a plurality of thermal interface material receiving cavities, at least a portion of a cross sectional area of the die placement area overlapping a cross sectional area of the plurality of thermal interface material receiving cavities; and
   a die attached to the die placement area, the thermal interface material contacting the circuit board to provide thermal linkage away from the plurality of thermal interface material receiving cavities and the thermal interface material to provide direct thermal linkage of the die and the circuit board, the circuit board including thermal vias to breach one surface of the circuit board and to contact the thermal interface material.

2. The apparatus of claim 1, wherein each of the plurality of thermal interface material receiving cavities comprises a recess.

3. The apparatus of claim 1, wherein each of the plurality of thermal interface material receiving cavities comprises a through hole.

4. The apparatus of claim 1, wherein the cross sectional area of the plurality of thermal interface material receiving cavities is from about 1 to about 100 mm$^2$.

5. The apparatus of claim 1, wherein the cross sectional area of the plurality of thermal interface material receiving cavities is registered to the cross sectional area of the die placement area.

6. The apparatus of claim 1, wherein a total cross sectional area of the plurality of thermal interface material receiving cavities is from about 1 to about 100 mm$^2$.

7. The apparatus of claim 1, wherein at least two of the thermal interface material receiving cavities are configured to be thermally coupled.

8. The apparatus of claim 1, wherein each of the thermal interface material receiving cavities is positioned under an area of maximum operating temperature of the die.

9. The apparatus of claim 1, wherein the thermal interface material is disposed in the plurality of thermal interface material receiving cavities.

10. An apparatus comprising:
    a substrate having a plurality of cavities;
    a circuit board to couple to one side of the substrate;
    a thermal interface material disposed in each of the plurality of cavities;
    a die supported by the substrate, the thermal interface material in thermal communication with the die, the thermal interface material to directly contact the circuit board, and the thermal interface material to provide direct thermal linkage of the die and the circuit board.

11. The apparatus of claim 10, wherein the thermal interface material occupies at least 10% of a volume of the plurality of cavities.

12. The apparatus of claim 10, wherein the thermal interface material is thermally coupled to at least one hot spot of the die.

13. The apparatus of claim 10, wherein the substrate comprises a printed circuit board.

14. The apparatus of claim 10, wherein the circuit board includes at least one thermal via thermally coupled to the thermal interface material.

15. The apparatus of claim 14, further comprising a plurality of electrical contacts disposed between the die and the circuit board.

16. The apparatus of claim 10, wherein the thermal interface material provides the direct thermal linkage from the die to the circuit board.

17. A method comprising:
    selecting a die placement area of a substrate;
    providing a plurality of voids in the substrate;
    providing a circuit board; and
    providing thermal interface material between a die on the die placement area and the circuit board such that the thermal interface material directly contacts the circuit board, at least a portion of the die placement area located in an area directly over the plurality of voids, the thermal interface material to provide direct thermal linkage of the die and the circuit board, the thermal interface material being provided in the plurality of voids, and the circuit board including thermal vias to breach one surface of the circuit board and to contact the thermal interface material.

18. The method of claim 17, wherein providing the plurality of voids comprises forming a groove in a surface of the substrate adjacent the die placement area.

19. The method of claim 17, wherein providing the plurality of voids comprises forming a recess in a surface of the substrate opposing the die placement area.

20. The method of claim 17, wherein providing the plurality of voids comprises forming a channel.

21. The method of claim 17, wherein providing the plurality of voids comprises drilling.

22. A system comprising:
- a bus;
- a memory coupled to the bus; and
- an electronic package assembly electrically connected to the bus, including:
  - a substrate having a plurality of openings;
  - a circuit board;
  - at least one microelectronic device supported on the substrate, the microelectronic device at least partially aligned to the plurality of openings; and
  - a thermal interface material disposed in the plurality of openings to thermally couple the at least one microelectronic device to the circuit board, the thermal interface material to provide direct thermal linkage of the at least one microelectronic device and the circuit board, and the circuit board including thermal vias to breach one surface of the circuit board and to contact the thermal interface material.

23. The system of claim 22, wherein the electronic package assembly comprises a flip chip package.

24. The system of claim 22, wherein the electronic package assembly comprises a stacked chip scale package.

25. The system of claim 22, wherein the thermal interface material provides the direct thermal linkage from the die to the circuit board.

* * * * *